United States Patent
Qi et al.

(10) Patent No.: US 9,575,117 B2
(45) Date of Patent: Feb. 21, 2017

(54) TESTING STACKED DEVICES

(71) Applicant: Advantest Corporation, Tokyo (JP)

(72) Inventors: Ling Qi, Cupertino, CA (US); Tung Sheng Hsieh, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 747 days.

(21) Appl. No.: 13/865,937

(22) Filed: Apr. 18, 2013

(65) Prior Publication Data

US 2014/0312926 A1 Oct. 23, 2014

(51) Int. Cl.
*G01R 31/20* (2006.01)
*G01R 31/28* (2006.01)

(52) U.S. Cl.
CPC ................. *G01R 31/2893* (2013.01)

(58) Field of Classification Search
CPC .................................. G01R 31/2893
See application file for complete search history.

(56) References Cited

U.S. PATENT DOCUMENTS

| | | | |
|---|---|---|---|
| 5,838,060 A * | 11/1998 | Comer | H01L 23/49827 257/665 |
| 7,202,693 B1 * | 4/2007 | Kush | G01R 31/2893 324/750.11 |
| 2014/0300382 A1 * | 10/2014 | Eckert | H01L 22/14 324/756.01 |

OTHER PUBLICATIONS

Package on Package, available at http://en.wikipedia.org/wiki/Package_on_package on Jan. 31, 2013.*

* cited by examiner

*Primary Examiner* — Daniel Miller

(57) ABSTRACT

Testing stacked devices. In accordance with a first method embodiment, a primary circuit assembly is accessed from a first circuit assembly carrier. The primary circuit assembly is placed into a test fixture. A secondary circuit assembly is accessed from a second circuit assembly carrier. The secondary circuit assembly is placed into the test fixture on top of the primary circuit assembly. The primary circuit assembly is tested in conjunction with said secondary circuit assembly while coupled together.

15 Claims, 9 Drawing Sheets

TESTING STACKED DEVICES

FIELD OF INVENTION

Embodiments of the present invention relate to the field of integrated circuit design, manufacture and test. More specifically, embodiments of the present invention relate to systems and methods for testing stacked devices.

BACKGROUND

Integrated circuit packages comprising two or more integrated circuit die are becoming increasing popular. Such packages, including, for example, stacked die packages, Package on Package (PoP), multi-chip modules and the like, offer increased circuit densities that may enable smaller end-product form factors, for example, smart phones.

Unfortunately, testing such packages, or the individual integrated circuit dice that make up such packages, is fraught with challenges. For example, many such integrated circuit arrangements require that all integrated circuit packages and/or dice must be electrically coupled in order to test any single die. Under such an arrangement, fault isolation may be difficult at best. In addition, test fixture parasitic effects, e.g., from long leads, may limit the speed and/or effectiveness of such testing.

SUMMARY OF THE INVENTION

Therefore, what is needed are systems and methods for testing stacked devices. What is additionally needed are systems and methods for testing stacked devices prior to their permanent joining. A further need exists for systems and methods for testing stacked devices that are compatible and complementary with existing systems and methods of integrated circuit design, manufacturing and test. Embodiments of the present invention provide these advantages.

In accordance with a first method embodiment, a primary circuit assembly is accessed from a first circuit assembly carrier. The primary circuit assembly is placed into a test fixture. A secondary circuit assembly is accessed from a second circuit assembly carrier. The secondary circuit assembly is placed into the test fixture on top of the primary circuit assembly. The primary circuit assembly is tested in conjunction with the secondary circuit assembly while coupled together.

In accordance with another method embodiment, a primary circuit assembly is accessed from a first circuit assembly carrier by a first pick and place arm. The primary circuit assembly is placed into a test fixture by the first pick and place arm. A secondary circuit assembly is accessed from a second circuit assembly carrier by a second pick and place arm. The secondary circuit assembly is placed into the test fixture on top of the primary circuit assembly by the second pick and place arm. The primary circuit assembly is tested in conjunction with the secondary circuit assembly while coupled together. The second pick and place arm may maintain contact with and apply force to the secondary circuit assembly sufficient for the secondary circuit assembly to electrically couple to the primary circuit assembly.

In accordance with another embodiment of the present invention, an apparatus comprises a test fixture configured to retain an integrated circuit assembly during testing. In addition, the apparatus comprises a pick and place device for moving the integrated circuit assembly to and from the test fixture. The apparatus further comprises first and second circuit assembly carriers for holding at least two different designs of integrated circuit.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1:
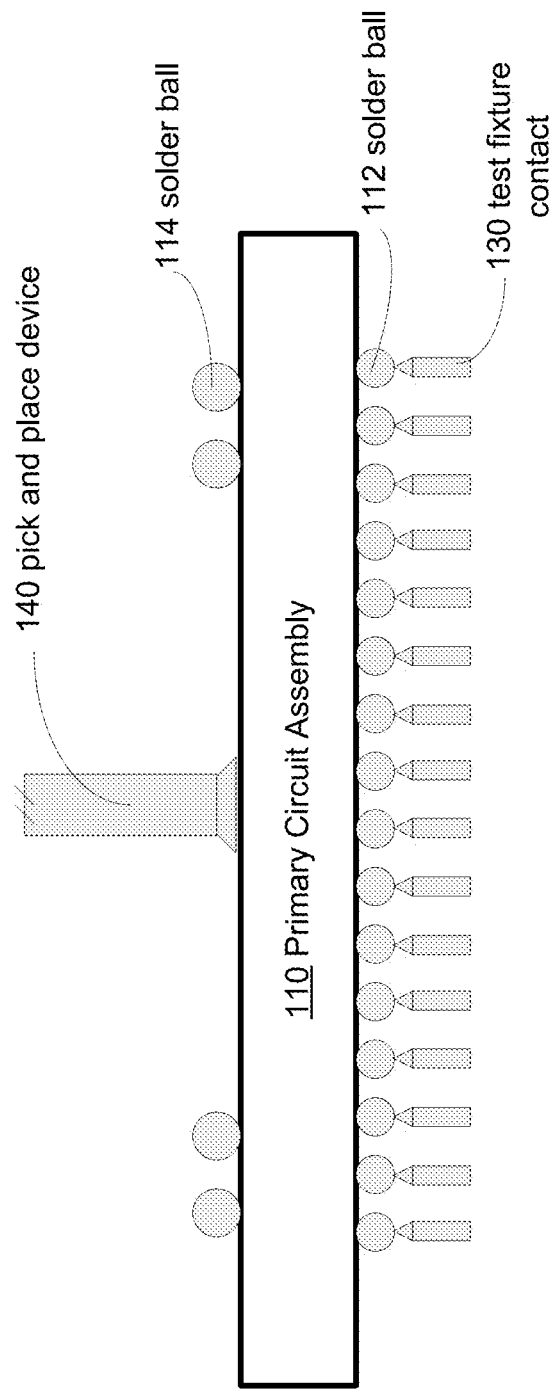
FIGS. 1 and 2 illustrate a method for testing stacked devices, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., methods 100, 300 and 800) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing" or "placing" or "testing" or "forming" or "mounting" or "removing" or "coating" or "attaching" or "processing" or "singulating" or "roughening" or "filling" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, the term "circuit assembly carrier" refers to a structure for holding and transporting, e.g., carrying, one or more circuit assemblies, e.g., in a semiconductor manufacturing and/or test facility. A circuit assembly carrier may be easily removed from material handling equipment, or a circuit assembly carrier may be considered a part of such equipment. The term "circuit assembly carrier" shall encompass items commonly known as "trays," "plates," "shuttles," "wafer carriers" and/or tape substrates, for example.

The term "pick and place" refers to the action of moving a circuit assembly from one location to another within manufacturing or test equipment. The term "pick and place arm" refers to a mechanism for moving, and in some cases, holding, one or more circuit assemblies within manufacturing or test equipment. For example, a pick and place arm may move a circuit assembly from a circuit assembly carrier to a test fixture. The actual mechanism may take any suitable form, including, for example, three-dimensional table-based arms, two-dimensional table-based arms, robotic arms on a fixed base and/or rotational transfer devices.

Testing Stacked Devices

Under the conventional art, it is common for a single test socket to be loaded by two pick and place arms in a "ping-pong" sequence. For example, a device to be tested is picked by a first "pick and place" arm from a first circuit assembly carrier and loaded into a test socket. It is to be appreciated that the first pick and place arm generally holds the first device in the test socket, e.g., to apply sufficient pressure to make electrical contact with the contacts of the test socket.

Meanwhile, a second pick and place arm picks a second device to be tested, e.g., of the same design as the first device, from a second circuit assembly carrier.

After testing of the first device is complete, the first pick and place arm removes the first device from the test socket and returns the device to the first circuit assembly carrier, or other suitable location, e.g., a "speed sort bin" corresponding to the test results for the first device.

As soon as the first device is clear of the test fixture, the second pick and place arm, which has already picked the second device, places the second device into the test fixture, and maintains sufficient pressure to make electrical contact with the contacts of the test socket. The roles of the two pick and place arms are now exchanged, and the first pick and place arm readies another device for test. It is appreciated that the testing may be performed while using a single pick and place arm, e.g., the same arm picks and places each device to be tested. However, by using two pick and place arms, the test fixture and associated testing electronics may have increased utilization in comparison to systems employing a single test arm.

In accordance with embodiments of the present invention, the device under test may be substantially any integrated circuit assembly, for example, a bare die, a die with added solder bumps, a packaged die, e.g., a "sub-package" of a package on package (POP) assembly, a whole wafer, a through-silicon via (TSV) structure, or a die placed on a wiring substrate, e.g., laminated printed circuit boards (PCB), thin films or ceramics.

Figure 2:
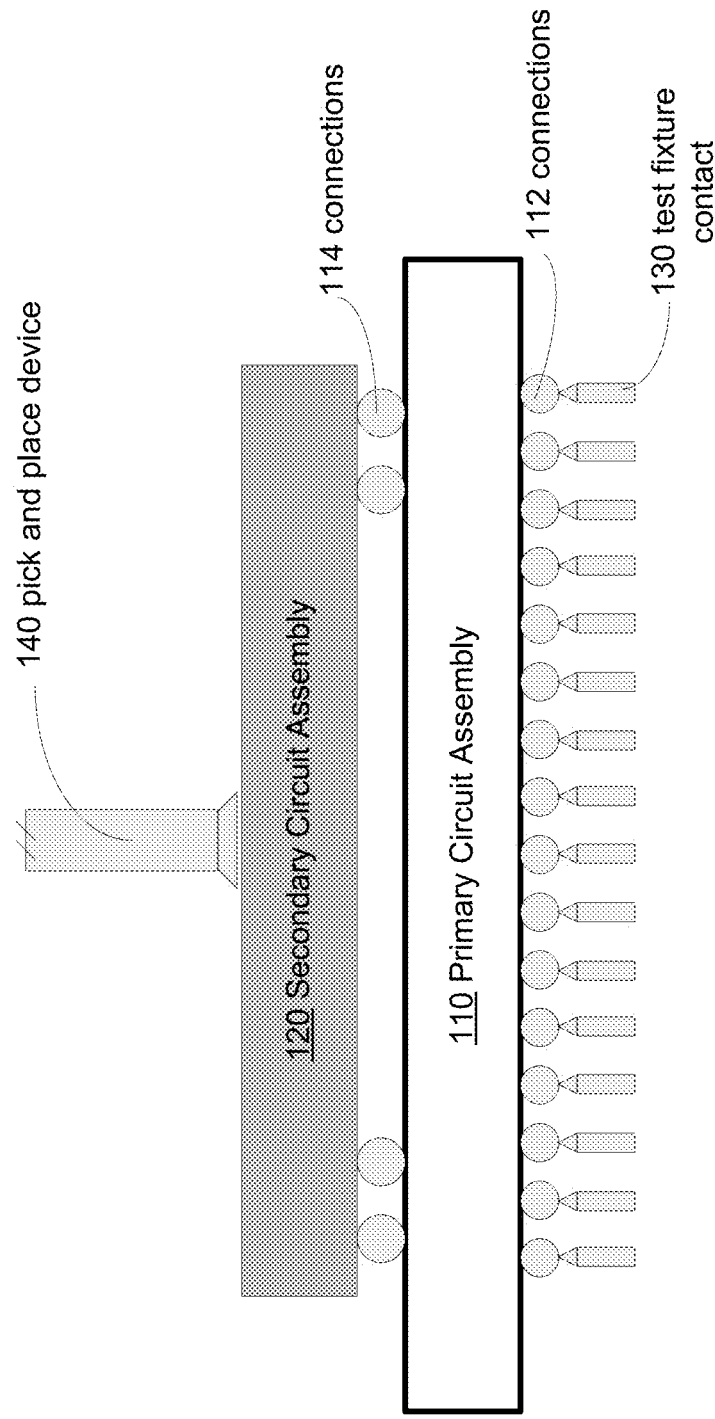

FIGS. 1 and 2 illustrate a method 100 for testing stacked devices, in accordance with embodiments of the present invention. FIG. 1 illustrates a side view of a primary circuit assembly 110 in a test fixture, in accordance with embodiments of the present invention. In FIG. 1, a primary circuit assembly 110 is picked from a first circuit assembly carrier (not shown) by pick and place device 140 and placed in a test fixture, in accordance with embodiments of the present invention. Primary circuit assembly 110 may be substantially any integrated circuit assembly, for example, a bare die, a die with added solder bumps, a packaged die, e.g., a "sub-package" of a package on package (POP) assembly, a whole wafer, a through-silicon via (TSV) structure, or a die placed on a wiring substrate, e.g., laminated printed circuit boards (PCB), thin films or ceramics.

For example, primary circuit assembly 110 may comprise a microprocessor die on a laminated printed circuit board. The microprocessor die may be electrically coupled to the laminated printed circuit board by wire bonds, in some embodiments. In other embodiments, the microprocessor die may be electrically coupled to the laminated printed circuit board by any suitable form of direct chip attach, e.g., solder balls and/or controlled chip collapse connections ("C4"). Primary circuit assembly 110 comprises connections 112 on a bottom surface and connections 114 on a top surface. Connections 112 and 114 may have solder balls applied, but that is not required. The connections 112 may have a difference size and/or spacing from the connections 114; however, that is not required. For example, the connections 112 may have a pitch alignment of 0.5 mm, while the connections 114 may have a pitch alignment of 0.65 mm. Typically, there will be more connections 112 on the bottom surface than connections 114 on the top surface, although that is not required.

The pick and place device 140 places primary circuit assembly into the test fixture so that the connections 112 are aligned with test fixture contacts 130. The pick and place device 140 then retreats, e.g., breaks contact with primary circuit assembly 110.

FIG. 2 illustrates a side view of a primary circuit assembly 110 and a secondary circuit assembly 120 in a test fixture, in accordance with embodiments of the present invention. In FIG. 2, a secondary circuit assembly 120 is picked from a second circuit assembly carrier (not shown) by pick and place device 140 and placed in position on top of primary circuit assembly 110, in accordance with embodiments of the present invention. Pick and place device 140 may represent two arms operating alternately to access two different circuit assemblies 110 and 120, or a single arm that accesses the two different circuit assemblies 110 and 120, in accordance with embodiments of the present invention.

For example, secondary circuit assembly 120 may comprise one or more memory dice on a laminated printed circuit board, e.g., packaged into a ball grid array (BGA)

type package. The memory dice may be electrically coupled to the laminated printed circuit board by wire bonds, in some embodiments. In other embodiments, the memory dice may be electrically coupled to the laminated printed circuit board by any suitable form of direct chip attach, e.g., solder balls and/or controlled chip collapse connections ("C4"). The memory dice may also be themselves stacked within the second circuit assembly 120. Secondary circuit assembly 120 may comprise solder balls on connections 114, e.g., if such balls are not included with primary circuit assembly 110.

Pick and place device 140 remains attached to secondary circuit assembly 120 during testing, e.g., to apply sufficient force for secondary circuit assembly 120 to make contact with primary circuit assembly 110, and for primary circuit assembly 110 to make contact with test fixture contacts 130.

In this novel manner, primary circuit assembly 110 and secondary circuit assembly 120 are advantageously tested together in a nearly finished configuration. In contrast, under the conventional art, a single instance of secondary circuit assembly 120 is typically placed somewhere in the test equipment, and coupled to contacts 114 of the primary circuit assembly 110 via relatively long test leads. Unfortunately, such long leads produce compromised electrical signals that may mask defects and/or limit the speed, e.g., frequency and/or duration, and/or effectiveness of such testing.

It is appreciated that the test apparatus comprises plates or circuit assembly carriers containing two different circuit assemblies, e.g., a first circuit assembly carrier comprising instances of primary circuit assembly 110, and a second circuit assembly carrier comprising instances of secondary circuit assembly 120, in accordance with embodiments of the present invention. This is in contrast to the convention art, in which, even if two or more pick and place arms are employed, all circuit assembly carriers contain parts of the same design.

In accordance with embodiments of the present invention, either primary circuit assembly 110 or secondary circuit assembly 120 may be a known good assembly, or have been previously tested. For example, a facility testing primary circuit assembly 110 may utilize the same secondary circuit assembly 120 to mate with and test large numbers of different instances of primary circuit assembly 110, in accordance with embodiments of the present invention.

It is to be further appreciated that multiple circuit assemblies, e.g., more than the illustrated two circuit assemblies, may be stacked and tested in this manner. For example, three or more circuit assemblies may be stacked, e.g., a first die above a second die above a third die. Alternatively, multiple circuit assemblies may be stacked on the same base assembly. For example, a first die may be stacked on a first portion of a second die, and a third die may be stacked on a second portion of the second die, e.g., the two "stacked" dice may be in substantially the same plane, in different horizontal locations above the second die. All such embodiments are to be considered within the scope of the present claimed invention.

Figure 3:
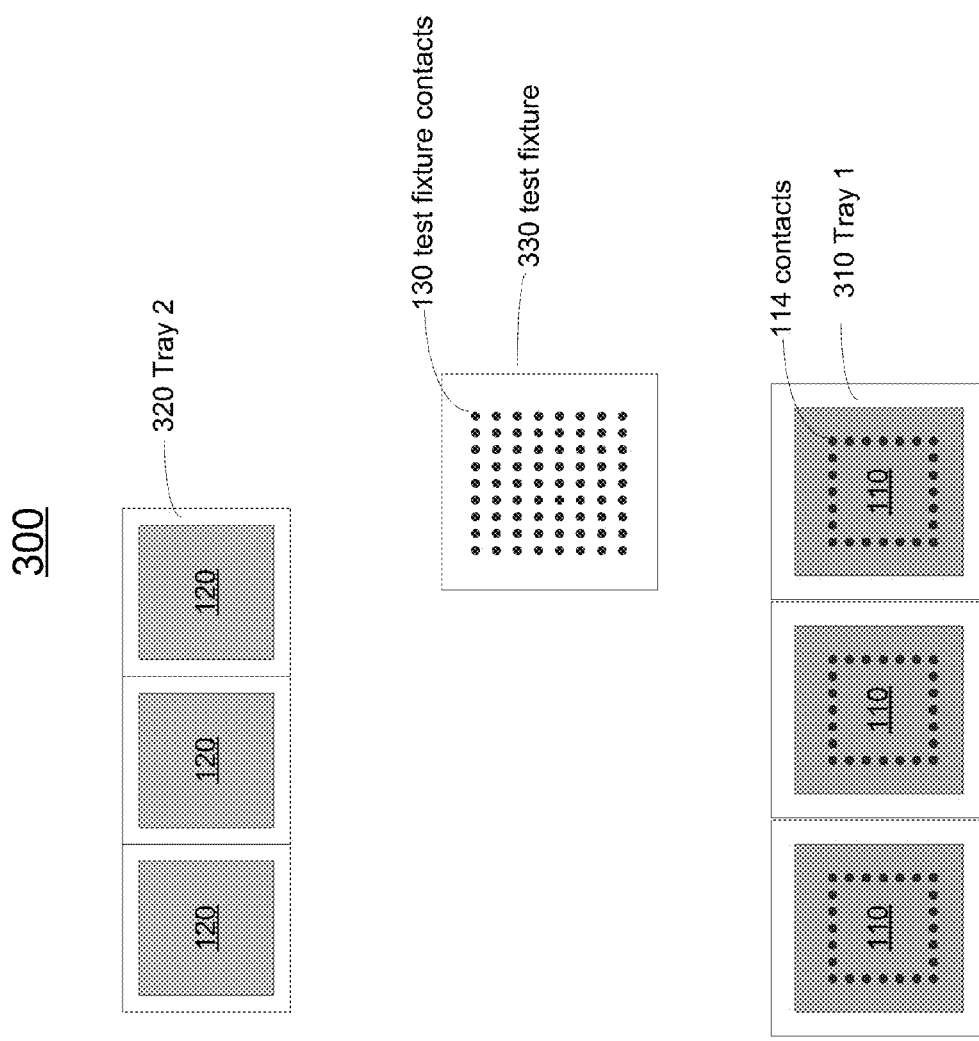
FIGS. 3, 4, 5, 6 and 7 illustrate a method for testing stacked devices in plan view, in accordance with embodiments of the present invention.

FIGS. 3 through 7 illustrate a method 300 for testing stacked devices in plan view, in accordance with embodiments of the present invention. In FIG. 3, one or more instances of primary circuit assembly 110 are arrayed in a first circuit assembly carrier one 310. It is appreciated that there will typically be more than the illustrated three instances of primary circuit assembly 110 in such a circuit assembly carrier. In addition, FIG. 3 illustrates one or more instances of secondary circuit assembly 120 arrayed in a second circuit assembly carrier two 320. It is appreciated that there will typically be more than the illustrated three instances of secondary circuit assembly 120 in such a circuit assembly carrier.

FIG. 3 further illustrates a test fixture 330 comprising test fixture contacts 130.

Figure 4:
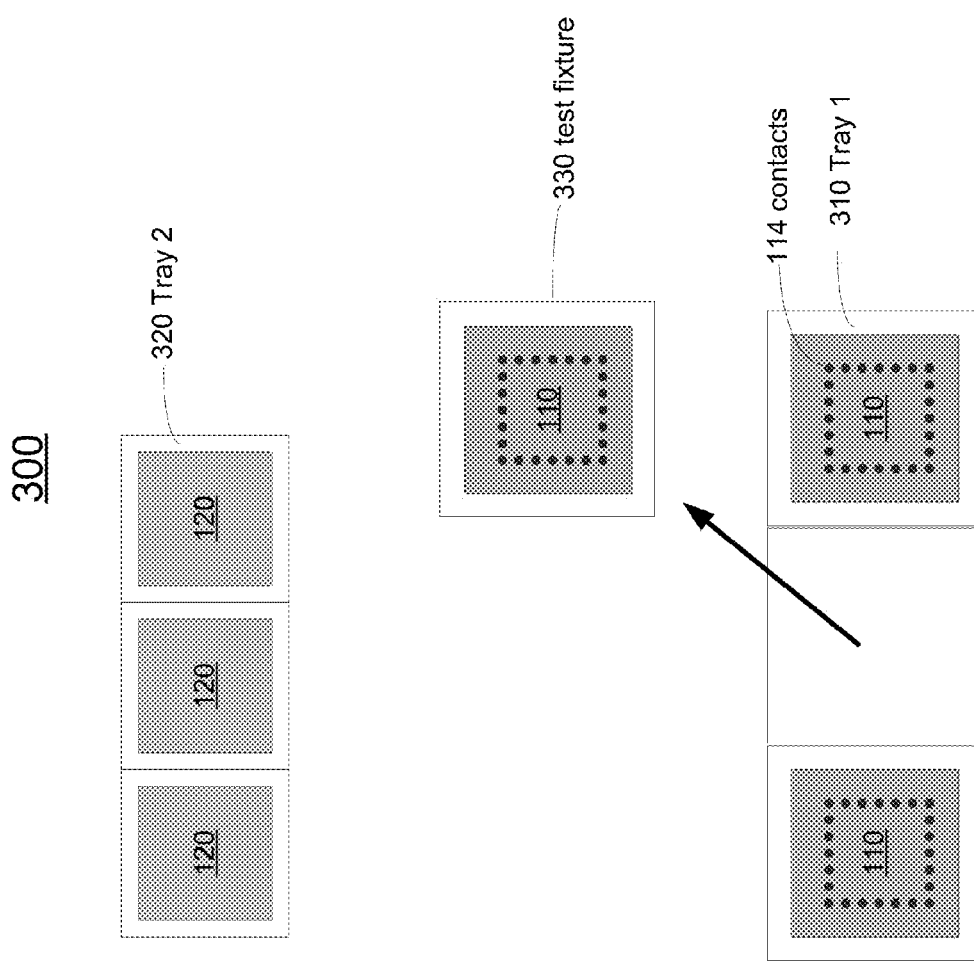

FIG. 4 illustrates picking one instance of primary circuit assembly 110 from circuit assembly carrier one 310 and placing that instance into test fixture 330. It is appreciated that the operation of picking and placing is typically performed by automated equipment, for example to ensure alignment with test fixture contacts 130.

Figure 5:
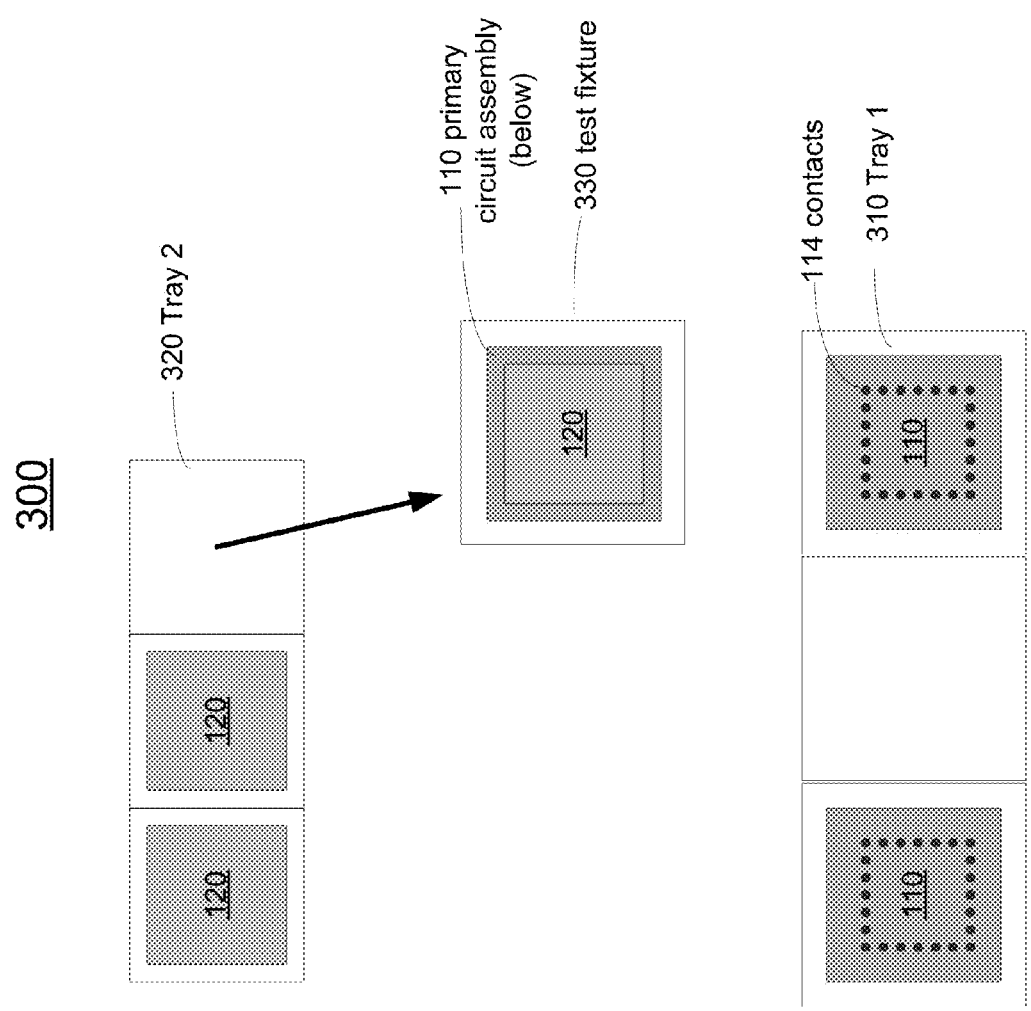

FIG. 5 illustrates picking one instance of secondary circuit assembly 120 from circuit assembly carrier two 320 and placing that instance into test fixture 330, on top of primary circuit assembly 110. It is appreciated that the operation of picking and placing is typically performed by automated equipment, for example to ensure alignment with contacts 114. The instance of secondary circuit assembly 120 may be picked and placed by the same or a difference device as picked and placed the instance of primary circuit assembly 110. It is appreciated that the pick and place device will typically remain attached to the instance of secondary circuit assembly 120, for example, to apply sufficient force for contacts 114 and 112 to electrically couple to test fixture contacts 130.

After secondary circuit assembly 120 is placed on primary circuit assembly 110 in the test fixture 330, the combination of primary circuit assembly 110 and secondary circuit assembly 120 is tested. For example, a series of test vectors stimulate contacts 112 of primary circuit assembly 110 via test fixture contacts 130, and the resulting electrical signals are recorded. It is appreciated that primary circuit assembly 110 will typically utilize and/or functionally test secondary circuit assembly 120 during the course of such testing. For example, a microprocessor embodiment of primary circuit assembly 110 may access information stored in a memory embodiment of secondary circuit assembly 120.

In this novel manner, primary circuit assembly 110 and secondary circuit assembly 120 are advantageously tested together in a nearly finished configuration.

Figure 6:
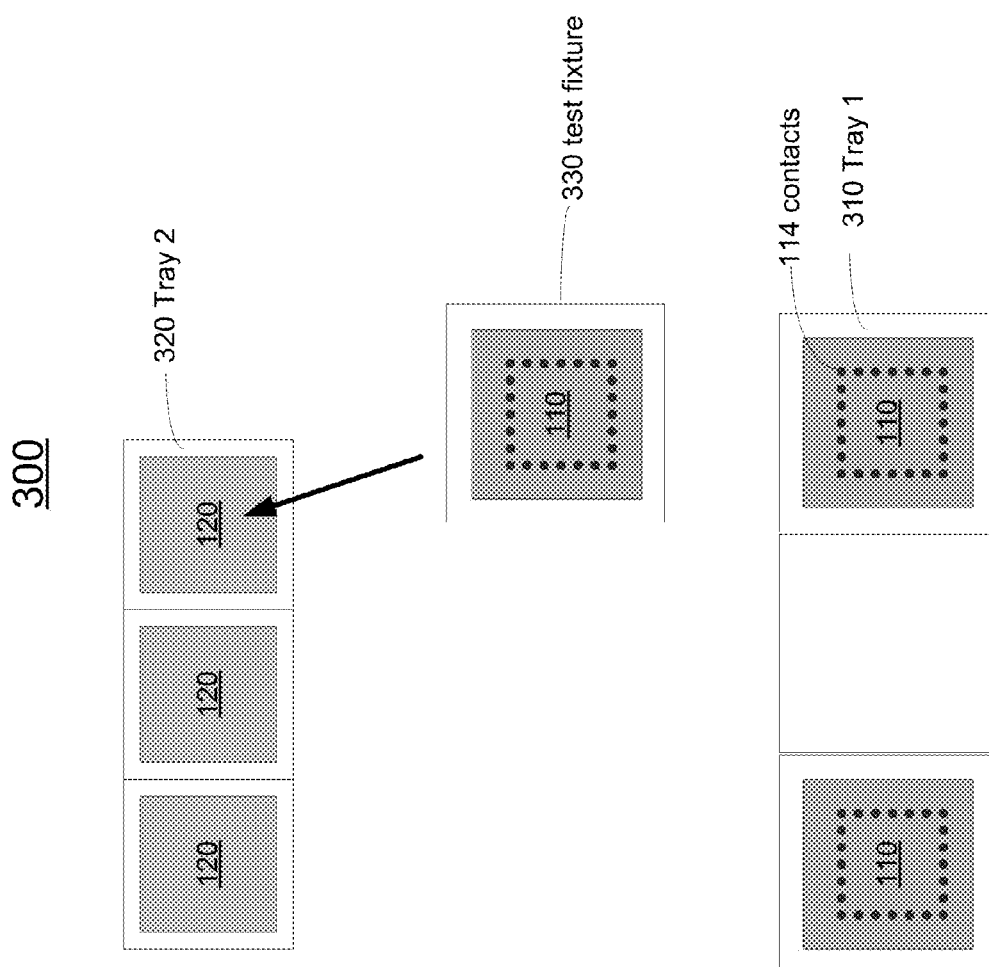
Figure 7:
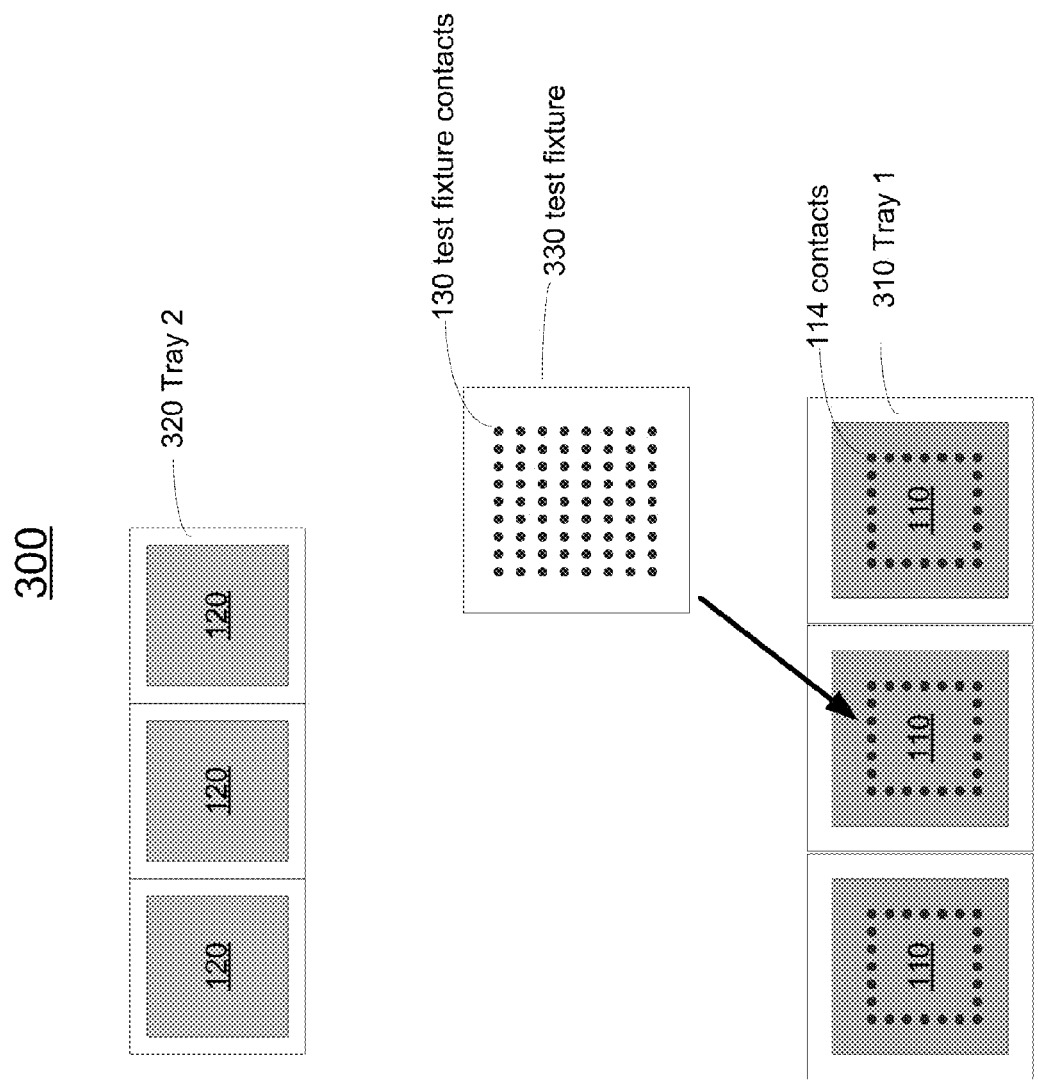

After testing is complete, the secondary circuit assembly 120 is returned to circuit assembly carrier two 320, or other suitable retainer, as illustrated in FIG. 6. Similarly primary circuit assembly 110 is returned to circuit assembly carrier one 310, or other suitable retainer, as illustrated in FIG. 7.

It is appreciated that a first pick and place arm, which removed the secondary circuit assembly 120, may access a second instance of primary circuit assembly 110 while a second pick and place arm is removing the first instance of primary circuit assembly 110. In this manner, the second instance of primary circuit assembly 110 may be placed in the test fixture 330 soon after the first instance of primary circuit assembly 110 is removed, e.g., while the second arm is replacing the first instance of primary circuit assembly 110 into circuit assembly carrier one 310. Similarly, the second arm may pick a second instance of secondary circuit assembly 120 and have it ready for placement as soon as the first arm has placed a second instance of primary circuit assembly 120 into the test fixture 330. In this novel manner, embodiments of the present invention are well suited to utilize conventional two arm testing apparatuses.

Figure 8:
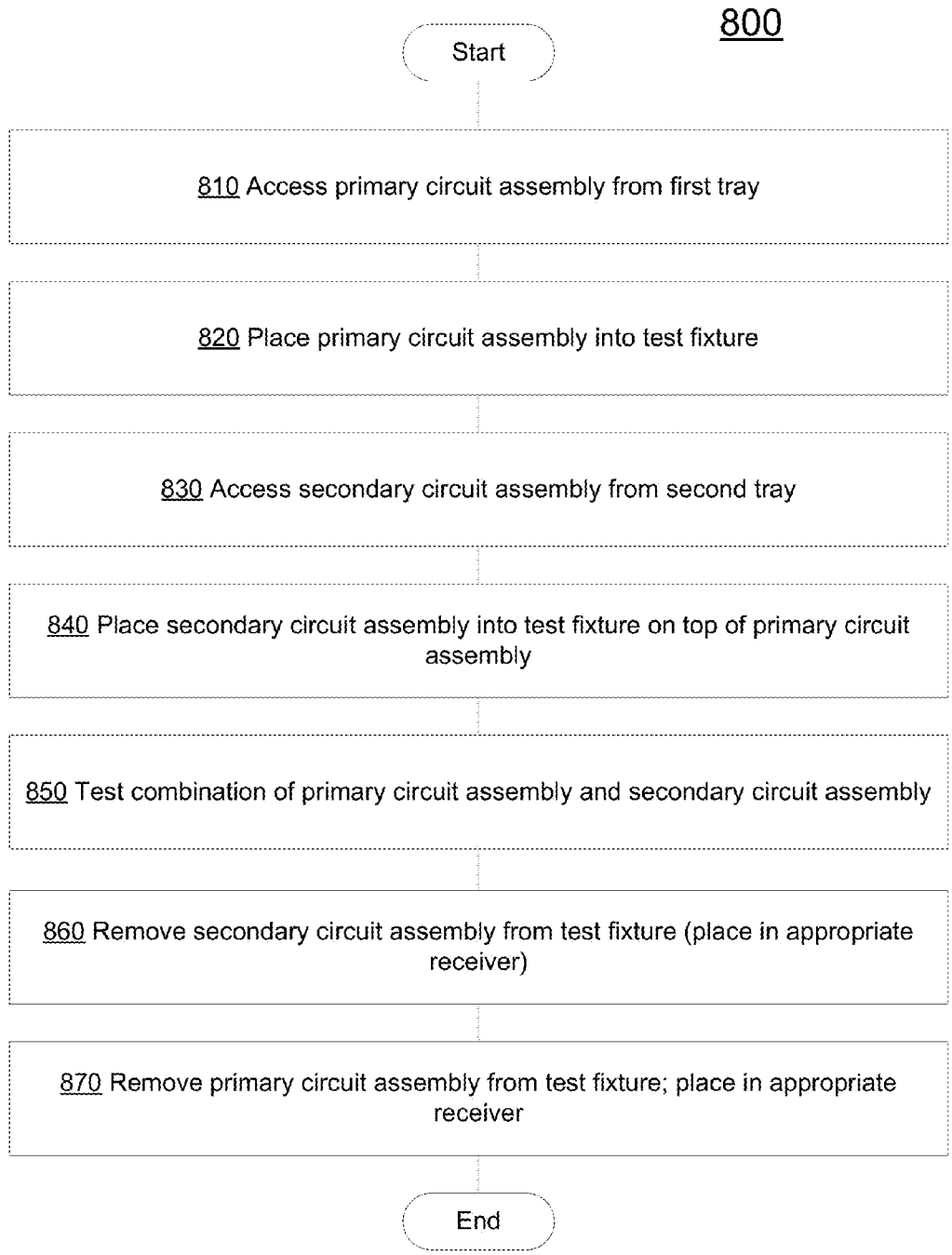
FIG. 8 illustrates a flow diagram of an exemplary method for testing stacked devices, in accordance with embodiments of the present invention.

FIG. 8 illustrates a flow diagram 800 of an exemplary method for testing stacked devices, in accordance with embodiments of the present invention. In 810, a primary circuit assembly, e.g., primary circuit assembly 110, as illustrated in FIG. 1, is accessed from a first carrier shuttle or circuit assembly carrier, e.g., circuit assembly carrier one 310, as illustrated in FIG. 3. In 820, the primary circuit assembly is placed into a test fixture, e.g., test fixture 330, as illustrated in FIG. 3.

In 830, a secondary circuit assembly, e.g., secondary circuit assembly 120, as illustrated in FIG. 1, is accessed from a second carrier shuttle or circuit assembly carrier, e.g., circuit assembly carrier two 320, as illustrated in FIG. 3. In 840, the secondary circuit assembly is placed into a test fixture, e.g., test fixture 330, as illustrated in FIG. 3, on top of the primary circuit assembly. It is appreciated that the pick and place device typically remains in contact with the second circuit assembly, for example, in order to apply sufficient force for the secondary circuit assembly to make contact with a primary circuit assembly, and for the primary circuit assembly to make contact with the test fixture contacts.

In 850, the combination of the primary circuit assembly and the secondary circuit assembly is tested. For example, both the primary circuit assembly and the secondary circuit assembly are tested in conjunction while mated. For example, a series of test vectors stimulate bottom contacts of a primary circuit assembly via test fixture contacts, and the resulting electrical signals are recorded. It is appreciated that a primary circuit assembly will typically utilize and/or functionally test a secondary circuit assembly during the course of such testing. For example, a microprocessor embodiment of a primary circuit assembly may access information stored in a memory embodiment of a secondary circuit assembly.

In 860, the secondary circuit assembly is removed from the test fixture and placed in an appropriate receiver. For example, the secondary circuit assembly may be replaced in the circuit assembly carrier from which it was accessed. Alternatively, the secondary circuit assembly may be placed into another shuttle or circuit assembly carrier, for example, corresponding to the results of the testing. In an alternative embodiment, the secondary circuit assembly may be retained by the pick and place device for use in a subsequent testing operation.

In 870, the primary circuit assembly is removed from the test fixture and placed in an appropriate receiver. For example, the primary circuit assembly may be replaced in the circuit assembly carrier from which it was accessed. Alternatively, the primary circuit assembly may be placed into another shuttle or circuit assembly carrier, for example, corresponding to the results of the testing. For example, a primary circuit assembly may be placed into a receiver according to a speed metric determined during the testing.

Figure 9A:
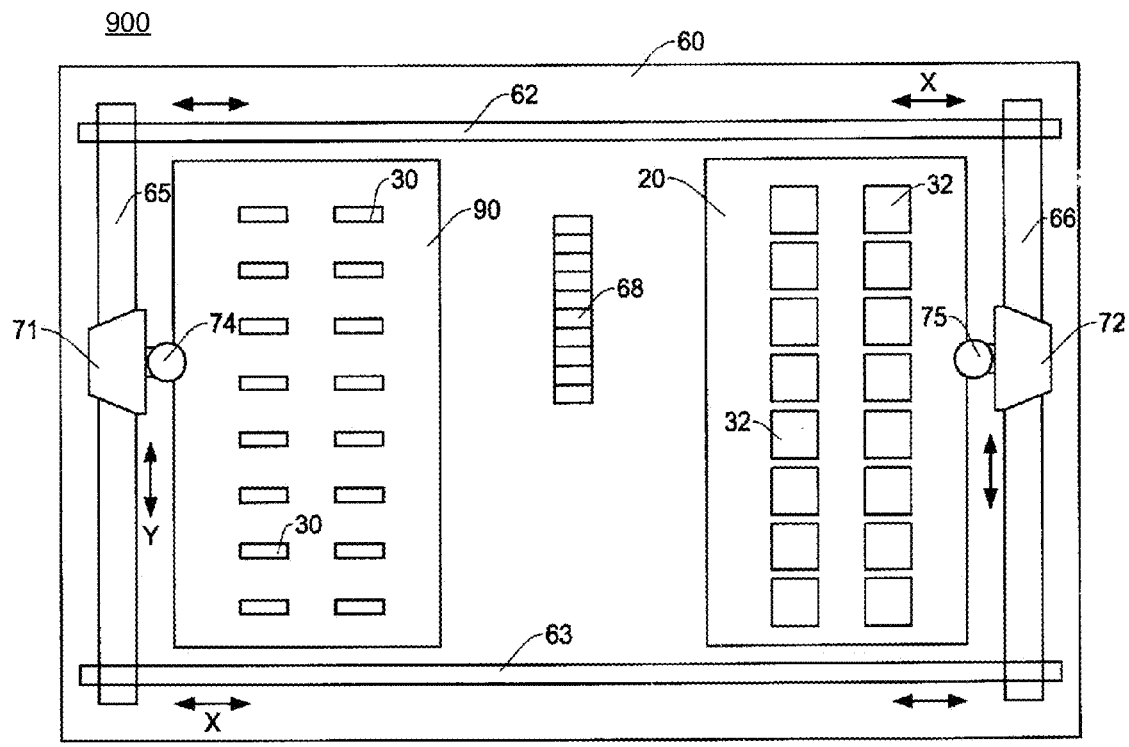
FIGS. 9A and 9B illustrate an exemplary pick and place apparatus, in accordance with embodiments of the present invention.

FIG. 9A illustrates a plan view of an exemplary pick and place apparatus 900, in accordance with embodiments of the present invention. The pick and place mechanism 60 uses a first pick and place arm 72 to transfer a first circuit assembly 32 from a first circuit assembly carrier 20 to a test fixture 68. A mobile arm 66 allows movements of the first pick and place arm 71 in a Y dimension, and rails 62 and 63 allow movements of the first pick and place arm 71 in an X dimension.

Similarly, the pick and place mechanism 60 uses a second pick and place arm 71 to transfer a second circuit assembly 30 from a second circuit assembly carrier 90 to the test fixture 68. A mobile arm 65 allows movements of the second pick and place arm 71 in a Y dimension, and rails 62 and 63 allow movements of the second pick and place arm 71 in an X dimension. In accordance with embodiments of the present invention, the second circuit assembly 30 is placed into test fixture 68 while the first circuit assembly 32 is still in the test fixture 68.

Figure 9B:
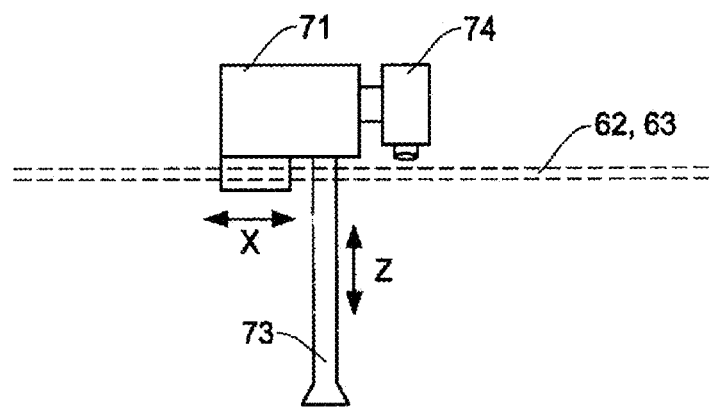

FIG. 9B illustrates a side view of the second pick and place mechanism 71, in accordance with embodiments of the present invention. The second pick and place mechanism 71 includes a suction arm 73 that performs suction (pick) and suction release (place) operations to move instances of second circuit assembly 30 from the second circuit assembly carrier 90 back and forth to the test fixture 68. The suction force is created, for example, by a negative pressure such as vacuum. The suction arm 73 moves in a Z (up-down or vertical) direction as shown in FIG. 9B. The first pick and place mechanism 72 is similarly constructed. The pick and place mechanisms 71 and 72 may optionally have cameras 74 and 75 attached for alignment and/or optical recognition.

It is to be appreciated that the second pick and place mechanism 71 is configured to apply force to the paired combination of the second circuit assembly 30 and the first circuit assembly 32 for the duration of a testing cycle. For example, the force should be sufficient for the second circuit assembly 30 to make contact with the first circuit assembly 32, and for first circuit assembly 32 to make contact with contacts of test fixture 68.

It is appreciated that the two circuit assembly carriers 20 and 90 contain circuit assemblies of different design, in accordance with embodiments of the present invention. For example, circuit assembly carrier 20 may contain instances of a microprocessor, while circuit assembly carrier 30 contains instances of a memory. As previously presented, the circuit assemblies may take any suitable form, e.g., a bare die, a die with solder bumps, a packaged die or a die placed on a wiring substrate, e.g., laminated printed circuit boards (PCB), thin films, ceramics or through-silicon vias (TSV). In some embodiments, circuit assemblies 32 and 30 may form parts of a Package on Package. In some embodiments, circuit assemblies 32 and 30 may form parts of a stacked die assembly.

Embodiments in accordance with the present invention provide systems and methods for testing stacked devices. In addition, embodiments in accordance with the present invention provide systems and methods for testing stacked devices prior to their permanent joining. Further, embodiments in accordance with the present invention provide systems and methods for testing stacked devices that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An electronically controlled method performed by a computerized testing system, said method comprising:
accessing a primary circuit assembly from a first circuit assembly carrier;
placing said primary circuit assembly into a test fixture;
accessing a secondary circuit assembly from a second circuit assembly carrier via a pick and place apparatus;
placing said secondary circuit assembly into said test fixture on top of said primary circuit assembly via said pick and place apparatus,
wherein said pick and place apparatus maintains contact with said secondary circuit assembly during and after said placing, and applies a force to said secondary circuit assembly sufficient for said secondary circuit assembly to electrically couple to said primary circuit assembly; and testing said primary circuit assembly in conjunction with said secondary circuit assembly while coupled together while said pick and place apparatus applies said force.

2. The method of claim 1 wherein said force is sufficient for said primary circuit assembly to electrically couple to said test fixture.

3. The method of claim 1 further comprising:

removing said primary circuit assembly from said test fixture; and placing said primary circuit assembly in a retainer according to results of said testing.

4. The method of claim 3 wherein said retainer is separate from said first circuit assembly carrier.

5. The method of claim 1 further comprising:

removing said secondary circuit assembly from said test fixture; and placing said secondary circuit assembly in a retainer according to results of said testing.

6. The method of claim 1 wherein said secondary circuit assembly is retained by a removal mechanism for testing with a different instance of a primary circuit assembly.

7. A computer controlled method performed by a testing system, said method comprising:

accessing a primary circuit assembly from a first circuit assembly carrier by a first pick and place arm;

placing said primary circuit assembly into a test fixture by said first pick and place arm;

accessing a secondary circuit assembly from a second circuit assembly carrier by a second pick and place arm;

placing said secondary circuit assembly into said test fixture on top of said primary circuit assembly by said second pick and place arm wherein said placing said secondary circuit assembly comprises said second pick and place arm maintaining contact with and applying force to said secondary circuit assembly sufficient for said secondary circuit assembly to electrically couple to said primary circuit assembly; and testing said primary circuit assembly in conjunction with said secondary circuit assembly while coupled together.

8. The method of claim 7 wherein said force is sufficient for said primary circuit assembly to electrically couple to said test fixture.

9. The method of claim 7 further comprising:

removing said primary circuit assembly from said test fixture via said first pick and place arm; and placing said primary circuit assembly in a retainer according to results of said testing.

10. The method of claim 9 wherein said retainer is separate from said first circuit assembly carrier.

11. The method of claim 7 further comprising:

removing said secondary circuit assembly from said test fixture via said second pick and place arm; and placing said secondary circuit assembly in a retainer according to results of said testing.

12. The method of claim 7 wherein said secondary circuit assembly is retained by said second pick and place arm for testing with a different instance of a primary circuit assembly.

13. An apparatus comprising:

a test fixture configured to retain an integrated circuit assembly during testing, wherein said integrated circuit assembly comprises an integrated circuit package;

first and second circuit assembly carriers for holding at least two different designs of integrated circuit;

a first pick and place arm configured for moving a first integrated circuit assembly between said test fixture and said first circuit assembly carrier;

a second pick and place arm configured for moving a second integrated circuit assembly between said test fixture and said second circuit assembly carrier, and wherein said second pick and place arm is configured for applying force to said second integrated circuit assembly sufficient for said second integrated circuit assembly to make electrical contact with said first integrated circuit assembly, and for said first integrated circuit assembly to make electrical contact with contact of said test fixture.

14. The apparatus of claim 13 wherein said integrated circuit package is configured to be part of a Package on Package.

15. The apparatus of claim 13 wherein said second pick and place arm is configured to retain said second integrated circuit assembly after testing of said first and second integrated circuit assemblies, and to place said second integrated circuit assembly onto another instance of said first integrated circuit assembly.

* * * * *